(12) United States Patent
Choi et al.

(10) Patent No.: US 7,713,826 B2
(45) Date of Patent: May 11, 2010

(54) METHOD OF MANUFACTURING SEMICONDUCTOR DEVICE

(75) Inventors: Chel Jong Choi, Daejeon (KR); Moon Gyu Jang, Daejeon (KR); Yark Yeon Kim, Daejeon (KR); Myung Sim Jun, Daejeon (KR); Tae Youb Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 19 days.

(21) Appl. No.: 12/045,797

(22) Filed: Mar. 11, 2008

(65) Prior Publication Data

US 2008/0299736 A1    Dec. 4, 2008

(30) Foreign Application Priority Data

May 29, 2007    (KR) .................. 10-2007-0051780

(51) Int. Cl.
*H01L 21/336*    (2006.01)

(52) U.S. Cl. ....................... 438/287; 438/591

(58) Field of Classification Search .............. 438/216, 438/261, 287, 591, E21.624
See application file for complete search history.

(56) References Cited

U.S. PATENT DOCUMENTS 6,495,474 B1 * 12/2002 Rafferty et al. ............. 438/766
6,657,267 B1 * 12/2003 Xiang et al. ................ 257/410
6,734,069 B2 * 5/2004 Eriguchi .................... 438/287
6,797,572 B1 * 9/2004 Jeon et al. .................. 438/287

FOREIGN PATENT DOCUMENTS

| KR | 10-1997-0030380 | 6/1997 |
| KR | 10-2003-0043337 | 6/2003 |
| KR | 10-2003-0050595 | 6/2003 |
| KR | 1020050012576 A | 2/2005 |
| KR | 1020050066936 A | 6/2005 |
| KR | 1020050072087 A | 7/2005 |
| KR | 10-2006-0005556 | 1/2006 |
| KR | 1020060059847 A | 6/2006 |
| WO | WO-2004/017377 A2 | 2/2004 |

\* cited by examiner

*Primary Examiner*—Mary Wilczewski
*Assistant Examiner*—Toniae M Thomas
(74) *Attorney, Agent, or Firm*—Rabin & Berdo, P.C.

(57) ABSTRACT

Provided is a method of manufacturing a semiconductor device including a high-k dielectric thin layer formed using an interfacial reaction. The method includes the steps of: forming an oxide layer on a silicon substrate; depositing a metal layer on the oxide layer to form a metal silicate layer using an interfacial reaction between the oxide layer and the metal layer; forming a metal gate by etching the metal silicate layer and the metal layer; and forming a lightly doped drain (LDD) region and source and drain regions in the silicon substrate after forming the metal gate. In this method, a semiconductor device having high quality and performance can be manufactured by a simpler process at lower cost.

16 Claims, 9 Drawing Sheets

METHOD OF MANUFACTURING SEMICONDUCTOR DEVICE

CROSS-REFERENCE TO RELATED APPLICATION

This application claims priority to and the benefit of Korean Patent Application No. 2007-51780, filed May 29, 2007, the disclosure of which is incorporated herein by reference in its entirety.

BACKGROUND

1. Field of the Invention

The present invention relates to a method of manufacturing a semiconductor, and more particularly, to a method of manufacturing a semiconductor device having a high-k dielectric thin layer formed by an interfacial reaction.

The present invention is derived from a project entitled "Future Technology Researches in the Fields of Information and Telecommunications [2200-S]" conducted as an IT R&D program for the Ministry of Information and Communication (Republic of Korea).

2. Discussion of Related Art

In a silicon-based field effect transistor (FET), it is necessary to form a gate with a linewidth of several tens of nm in order to increase integration density. To obtain the gate with a linewidth of several tens of nm, the physical thickness of a conventional gate insulating layer should be reduced to 1 nm or less. In this case, however, the number of electrons tunneling directly through the gate insulating layer increases sharply, thereby increasing a leakage current of the silicon-based FET.

Typically, a gate insulating layer of an FET is formed of $SiO_2$, which is obtained using a thermal oxidation process and known as a very physicochemically stable material. However, as stated above, although it is desired that the thickness of an $SiO_2$ gate insulating layer be reduced to increase the integration density of an FET, when the $SiO_2$ gate insulating layer has a predetermined thickness or less, a leakage current characteristic of the FET deteriorates, thus degrading reliability of the FET. Therefore, it is theoretically calculated that the most appropriate physical thickness of the $SiO_2$ gate insulating layer is about 1.6 nm.

In order to overcome the drawbacks of the foregoing $SiO_2$ gate insulating layer, a high-k dielectric layer has been proposed. Generally speaking, a high-k dielectric material is a material having a higher dielectric constant than the dielectric constant (k=3.9) of $SiO_2$. High-k dielectric materials on which a vast amount of research has recently been conducted include Group IV metal oxides, such as $HfO_2$ and $ZrO_2$, and rare-earth element oxides, such as $La_2O_3$, $Gd_2O_3$, and $Y_2O_3$. The foregoing oxides have high dielectric constants, good thermal stability, and wide band offsets to silicon.

The most typical method of manufacturing a high-k dielectric thin layer is an atomic layer deposition (ALD) method disclosed in Korean Patent Publication No. 10-2005-0072087. A method of manufacturing a high-k dielectric thin layer using an ALD technique involves controlling the thickness of the high-k dielectric thin layer by alternately injecting a precursor and a co-reactant in a pulse type into the surface of a grown layer. However, according to the ALD method, it is very difficult to obtain a precursor appropriate for a high-k dielectric thin layer to be manufactured. Moreover, a large amount of silicon dangling bond is formed at an interface of the high-k dielectric thin layer manufactured using the ALD method, thereby increasing the density of interfacial state.

Also, Korean Patent Publication No. 10-2006-0059847 teaches a method of manufacturing a high-k dielectric layer using a chemical reaction, such as hydrolysis. Specifically, a solid solution with a Perovskite structure based on barium lanthanide poly-titanate may be formed using a chemical reaction, such as hydrolysis. The solid solution may include at least one of $BaLn_2(Ti_{1-x}M_x)_4O_{12}$, $BaLn_2(Ti_{1-x}M_x)_3O_{10}$, $BaLn_2(Ti_{1-x}M_x)_2O_8$, and $(Ba,Ln)(Ti_{1-x-y}M_xTa_y)O_5$ (Ln=La, Ce, Pr, Nd, Sm, Eu, Gd, Tb, Dy, Ho, Er, Tm, Yb, Lu, Y; M=Zr, Hf; x, y=0~1). The foregoing method is relatively simple and enables formation of a high-k dielectric layer in large quantities. However, a chemical reaction required for forming the high-k dielectric layer is inadequate for a typical process of manufacturing a silicon semiconductor device.

SUMMARY OF THE INVENTION

The present invention is directed to a method of manufacturing a semiconductor device including a metal silicate thin layer formed by an interfacial reaction between an oxide layer and a metal layer.

One aspect of the present invention is to provide a method of manufacturing a semiconductor device. The method includes the steps of: forming an oxide layer on a silicon substrate; depositing a metal layer on the oxide layer to form a metal silicate layer using an interfacial reaction between the oxide layer and the metal layer; forming a metal gate by etching the metal silicate layer and the metal layer; and forming a lightly doped drain (LDD) region and source and drain regions in the silicon substrate after forming the metal gate.

Another aspect of the present invention is to provide a method of manufacturing a semiconductor device. The method includes the steps of: forming an oxide layer on a silicon substrate; depositing a metal layer on the oxide layer to form a metal silicate layer using an interfacial reaction between the oxide layer and the metal layer; depositing a metal layer for a gate electrode after removing the remaining metal layer which is unreacted in the interfacial reaction step; and forming a lightly doped drain (LDD) region and source and drain regions in the silicon substrate after etching the metal layer for a gate electrode and the metal silicate layer.

The interfacial reaction may be induced by performing an annealing process after depositing the metal layer on the oxide layer. Alternatively, the interfacial reaction may be induced by kinetic energy that is spontaneously generated during the deposition of the metal layer on the oxide layer. In order to induce the interfacial reaction due to kinetic energy, the metal layer may be formed of a rare-earth material or a transition metal.

The silicon substrate may be one selected from the group consisting of a single crystalline silicon substrate, a polycrystalline silicon substrate, a doped silicon substrate, an amorphous silicon substrate, a $Si_xGe_{1-x}$ (0<x<1) substrate, a $Si_xN_{1-x}$ (0<x<1) substrate, and an SiC substrate. The oxide layer may be formed of a combination of oxygen and one selected from the group consisting of Si, Ga, Ge, Ce, Pr, Nd, Pm, Sm, Eu, Gd, Tb, Dy, Ho, Er, Tm, Yb, Lu, Ni, Ti, Co, Cu, Pt, W, Cr, Mo, W, Au, Ag, Zn, Ir, Ta, Hf, K, Li, Cs and an alloy thereof. Also, the metal layer may be formed of at least one selected from the group consisting of Ce, Pr, Nd, Pm, Sm, Eu, Gd, Tb, Dy, Ho, Er, Tm, Yb, Lu, Ni, Ti, Co, Cu, Pt, W, Cr, Mo, W, Au, Ag, Zn, Ir, Ta, Hf, K, Li, Cs and an alloy thereof.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

A semiconductor device and a method of manufacturing semiconductor device according to the present invention will now be described more fully hereinafter with reference to the accompanying drawings, in which exemplary embodiments of the invention are shown. This invention may, however, be embodied in different forms and should not be construed as limited to the embodiments set forth herein.

FIGS. 1A through 1D are cross-sectional views illustrating a method of manufacturing a metal-compound semiconductor field effect transistor (FET) according to an exemplary embodiment of the present invention.

Figure 1A:
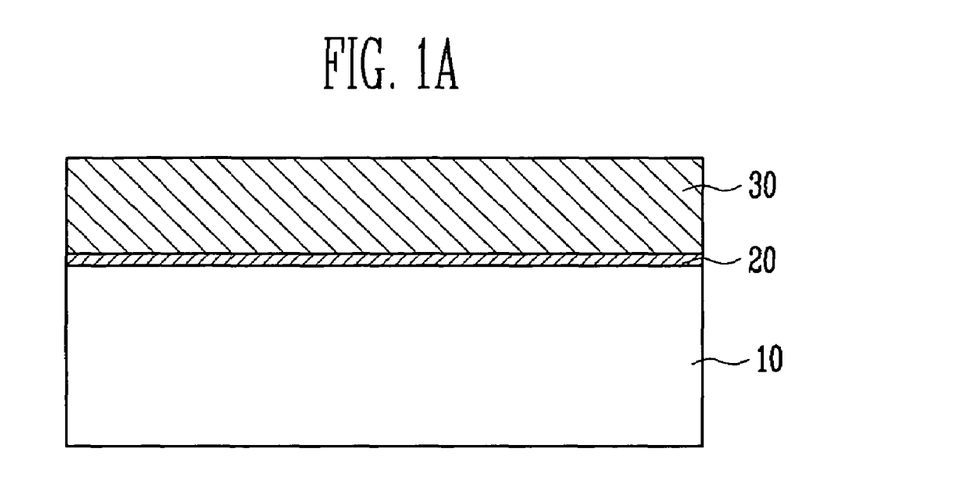
FIGS. 1A through 1D are cross-sectional views illustrating a method of manufacturing a semiconductor field effect transistor (FET) according to an exemplary embodiment of the present invention.

Referring to FIG. 1A, in order to manufacture an FET, an oxide layer 20 is formed on a substrate 10, and a metal oxide layer 30 is formed on the oxide layer 20.

The substrate 10 may be a single-crystalline silicon substrate. However, the present invention is not limited thereto and the substrate 10 may be any Si-containing substrate, such as a polycrystalline silicon (poly-Si) substrate, an amorphous silicon (a-Si) substrate, a Si$_x$Ge$_{1-x}$ (0<x<1) substrate, a Si$_x$N$_{1-x}$ (0<x<1) substrate, or an SiC substrate.

The oxide layer 20 may be formed of a combination of oxygen and one selected from the group consisting of Si, Ga, Ge, Ce, Pr, Nd, Pm, Sm, Eu, Gd, Tb, Dy, Ho, Er, Tm, Yb, Lu, Ni, Ti, Co, Cu, Pt, W, Cr, Mo, W, Au, Ag, Zn, Ir, Ta, Hf, K, Li, Cs and an alloy thereof. Specifically, the oxide layer 20 may be formed by depositing any oxygen-containing material, such as SiO$_2$, SiON, HfO$_2$, ZrO$_2$, Er$_2$O$_3$, Y$_2$O$_3$, Gd$_2$O$_3$, Al$_2$O$_3$, ZnO, SnO$_2$, or indium tin oxide (ITO). The oxide layer 20 may be formed by a thermal oxidation process, a sputtering process, an electronic beam (e-beam) evaporation process, a chemical vapor deposition (CVD) process, a physical vapor deposition (PVD) process, a metal-organic chemical vapor deposition (MOCVD) process, a molecular beam epitaxy (MBE) process, or an atomic layer deposition (ALD) process. However, the present invention is not limited to the above-described deposition processes, and any other deposition process may be used to form the oxide layer 20.

The metal layer 30 formed on the oxide layer 20 may be formed of at least one selected from the group consisting of Ce, Pr, Nd, Pm, Sm, Eu, Gd, Tb, Dy, Ho, Er, Tm, Yb, Lu, Ni, Ti, Co, Cu, Pt, W, Cr, Mo, W, Au, Ag, Zn, Ir, Ta, Hf, K, Li, Cs and an alloy thereof. The metal layer 30 may be formed by a sputtering process, an e-beam evaporation process, a CVD process, a PVD process, an MOCVD process, a MBE process, or an ALD process. However, the present invention is not limited to the above-described deposition processes, and any other deposition process may be used to form the metal layer 30.

Figure 1B:
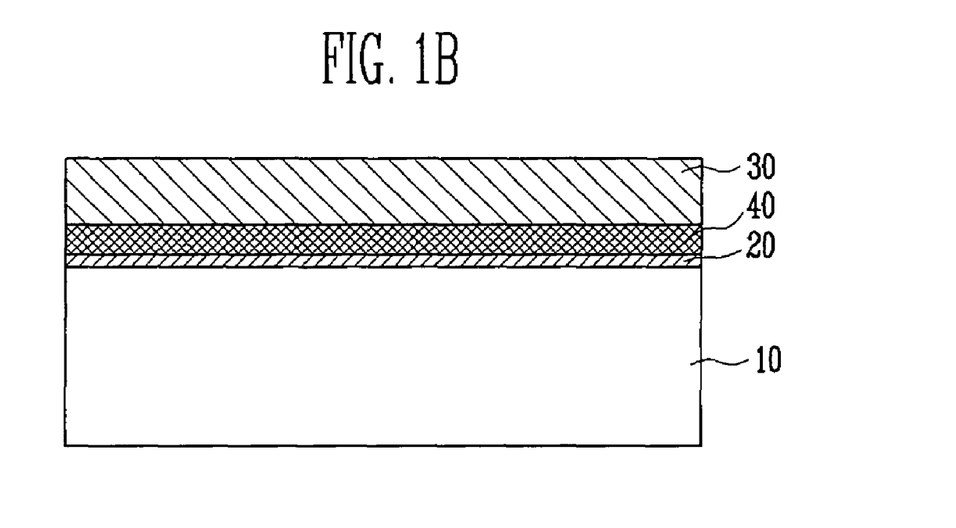

Referring to FIG. 1B, after forming the oxide layer 20 and the metal layer on the substrate 10, a process for inducing an interfacial reaction may be performed to form a high-k dielectric metal silicate layer 40 between the oxide layer 20 and the metal layer 30. Here, the interfacial reaction refers to an atomic reaction between the oxide layer 20 and the metal layer 30 due to external energy, which physicochemically changes the oxide layer 20 and the metal layer 30. Thus, in order to induce the interfacial reaction between the oxide layer 20 and the metal layer 30, it is necessary to supply thermal energy to the oxide layer 20 and the metal layer 30 using a thermal treatment or induce kinetic energy during the processes of depositing the oxide layer 20 and the metal layer 30.

When supplying thermal energy to the oxide layer 20 and the metal layer 30 to induce an interfacial reaction, the temperature at which a thermal treatment is performed should be controlled according to the thicknesses of the metal layer 30 and the oxide layer 20. For example, when the metal layer 30 and the oxide layer 20 are deposited to thicknesses of 43 nm and 6.15 nm, respectively, the metal layer 30 and the oxide layer 20 may be thermally treated at a temperature of about 350° C. or lower to induce the interfacial reaction, so that the high-k dielectric metal silicate layer 40 with high stability can be formed. However, when the metal layer 30 and the oxide layer 20 are thermally treated at a temperature above 350° C., the metal layer 30 excessively reacts with the oxide layer 20, thereby forming the high-k dielectric metal silicate layer 40 having a high leakage current.

When inducing kinetic energy during a deposition process to induce an interfacial reaction, the metal layer 30 formed on the oxide layer 20 may be formed of a rare-earth material containing Er. Thus, the kinetic energy is induced during the deposition of the metal layer 30 using a rare-earth material, so that a reaction between the metal layer 30 and the oxide layer 20 is induced to form the metal silicate layer 40.

Figure 1C:
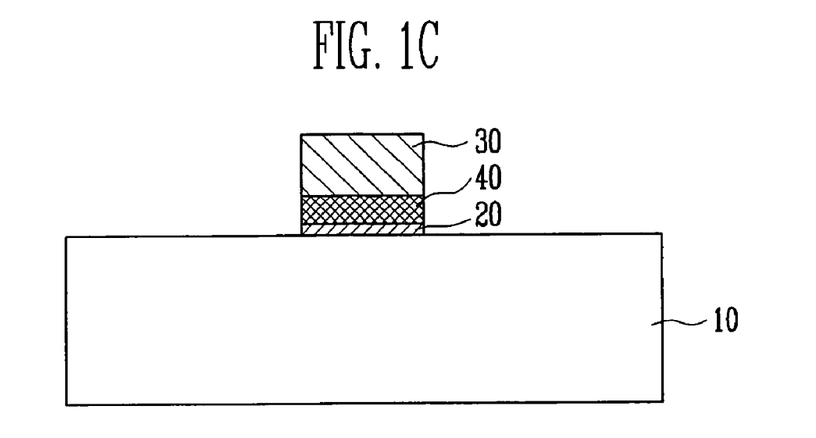
Figure 1D:
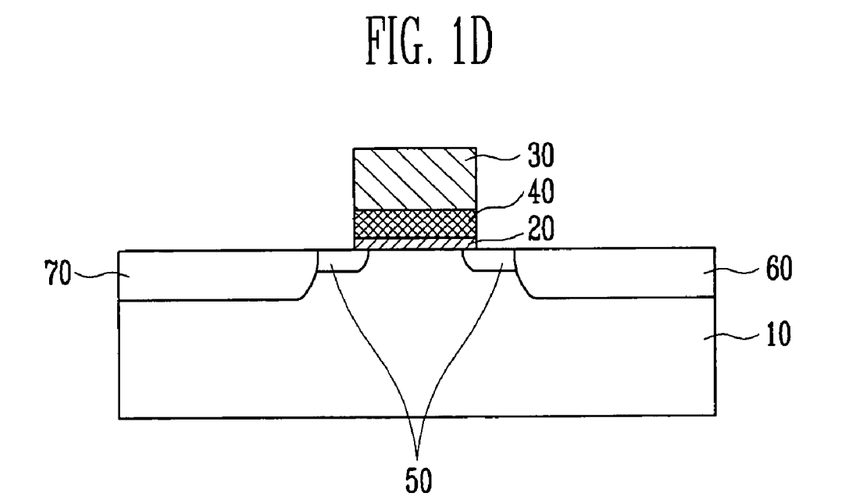

Referring to FIGS. 1C and 1D, the metal layer 30, the metal silicate layer 40, and the oxide layer 20 are etched to form a metal gate electrode after forming the high-k dielectric metal silicate layer 40 through an interfacial reaction between the oxide layer 20 and the metal layer 30. Thereafter, a lightly doped drain (LDD) region 50 and source and drain electrodes 60 and 70 are formed in the substrate 10. The semiconductor device having the above-described construction may be a complementary metal oxide semiconductor (CMOS) logic device, a memory device, or an embedded memory device.

Figure 2:
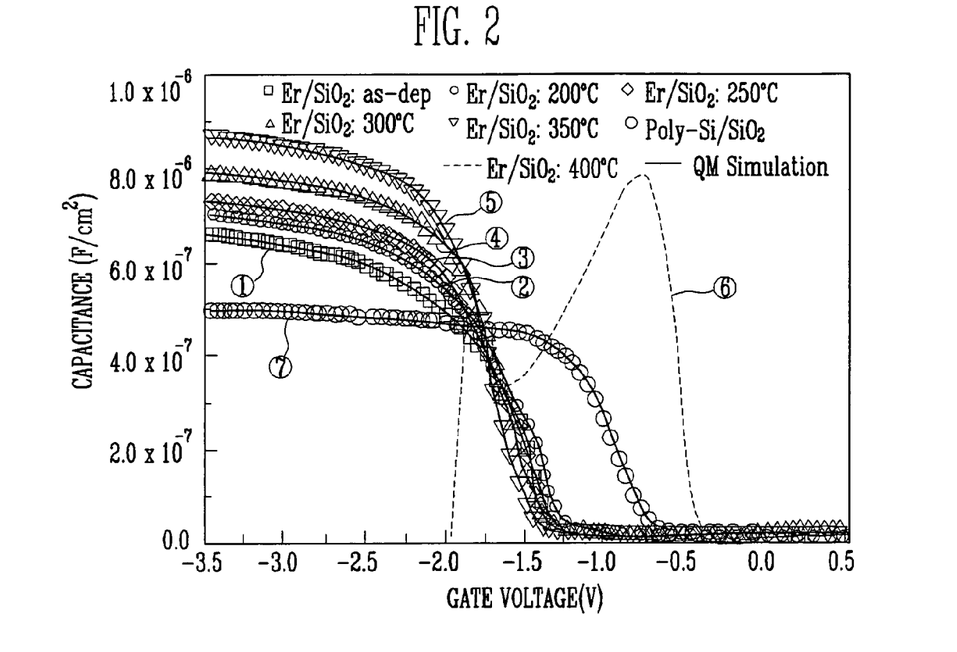
FIG. 2 is a graph of capacitance versus gate voltage of an Er/SiO$_2$ gate capacitor according to an exemplary embodiment of the present invention.

FIG. 2 is a graph of capacitance versus gate voltage of a gate capacitor including an Er layer and a SiO$_2$ layer according to an exemplary embodiment of the present invention, and Table 1 shows equivalent oxide thickness (EOT) and flat-band voltage ($V_{fb}$) values obtained from a simulation considering a quantum effect.

Referring to FIG. 2 and Table 1, an Er metal layer is deposited to a thickness of 43 nm on a $SiO_2$ oxide layer with a thickness of 6.15 nm, annealed at various temperatures, and etched to manufacture an $Er/SiO_2$ gate capacitor. FIG. 2 is a graph of capacitance versus gate voltage in the $Er/SiO_2$ gate capacitor, and Table 1 shows EOT and $V_{fb}$ values of the $Er/SiO_2$ gate capacitor. Also, in order to confirm if a high-k dielectric thin layer is formed, FIG. 2 also shows a graph of capacitance versus gate voltage in a gate capacitor including a gate electrode that is formed by depositing an N-type poly-Si layer as a metal layer on a $SiO_2$ layer with a thickness of 6.15 nm.

In FIG. 2, an abscissa denotes a gate voltage and an ordinate denotes a capacitance. In FIG. 2, curve ① shows a case where Er and $SiO_2$ layers were deposited, curve ② shows a case where the Er and $SiO_2$ layers were annealed at a temperature of about 200° C., curve ③ shows a case where the Er and $SiO_2$ layers were annealed at a temperature of about 250° C., curve ④ shows a case where the Er and $SiO_2$ layers were annealed at a temperature of about 300° C., curve ⑤ shows a case where the Er and $SiO_2$ layers were annealed at a temperature of about 350° C., curve ⑥ shows a case where the Er and $SiO_2$ layers were annealed at a temperature of about 400° C., and curve ⑦ shows a case where the poly-Si layer was formed on the $SiO_2$ layer.

Referring to Table 1, the N-type poly-$Si/SiO_2$ gate capacitor had an EOT of about 6.4 nm, which was about equal to the initial deposited thickness of the $SiO_2$ layer considering a poly-depletion effect. Meanwhile, the $Er/SiO_2$ gate capacitor had an EOT of about 4.7 nm before an annealing process, but it could be observed that as an annealing temperature was increased to 350° C., the EOT of the $Er/SiO_2$ gate capacitor was decreased to 3.4 nm. Therefore, it could be concluded that when the Er metal layer was deposited on the $SiO_2$ layer, a higher-k dielectric metal silicate layer could be formed. Furthermore, when an annealing process was performed on the deposited Er and $SiO_2$ layers by raising a temperature, the $Er/SiO_2$ gate capacitor could have a higher-k dielectric characteristic.

TABLE 1

| Gate capacitor | | EOT(nm) | $V_{fb}$(V) |
| --- | --- | --- | --- |
| $Er/SiO_2$ | As deposited | 4.7 | −1.43 |
| | 200° C. | 4.4 | −1.37 |
| | 250° C. | 4.2 | −1.45 |
| | 300° C. | 3.9 | −1.48 |
| | 350° C. | 3.4 | −1.54 |
| Poly-$Si/SiO_2$ | | 6.4 | −0.84 |

Referring to FIG. 2, however, in case ⑥ where the $Er/SiO_2$ gate capacitor was annealed at a temperature of about 400° C., a leakage current was increased, thereby degrading the characteristics of the gate capacitor. In other words, as the gate voltage negatively was increased, the capacitance of the $Er/SiO_2$ gate capacitor was decreased unlike in cases ① to ⑤. Therefore, the Er and $SiO_2$ layers needs to be annealed at temperatures below 400° C.

Figure 3:
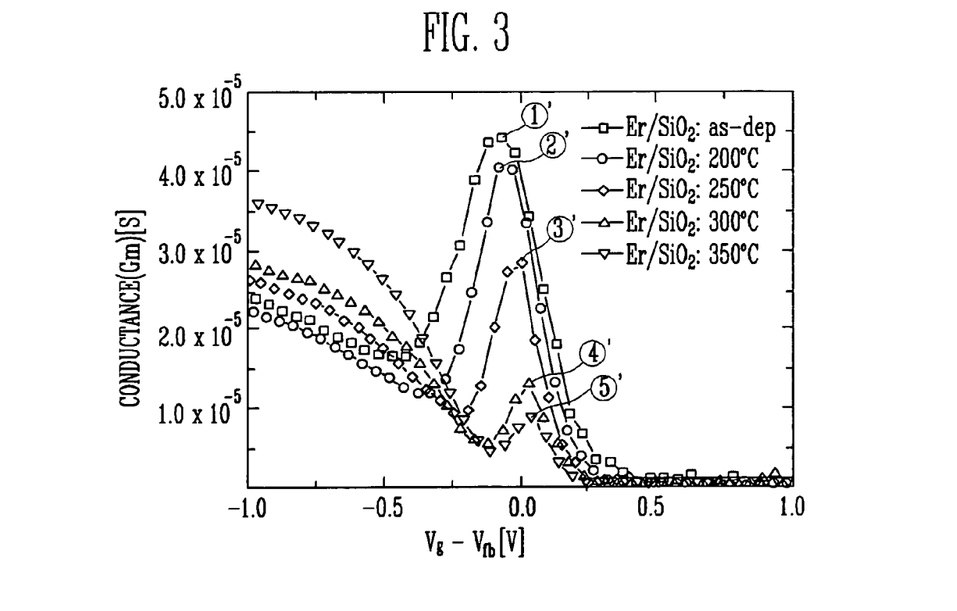
FIG. 3 is a graph of conductance versus gate voltage of the Er/SiO$_2$ gate capacitor shown in FIG. 2.

FIG. 3 is a graph of conductance versus gate voltage in the $Er/SiO_2$ gate capacitor shown in FIG. 2.

In FIG. 3, an abscissa denotes a gate voltage–flat band voltage ($V_g - V_{fb}$) and an ordinate denotes conductance ($G_m$) [S]. Curve ①' shows a case where the Er and $SiO_2$ layers were not annealed, curve ②' shows a case where the Er and $SiO_2$ layers were annealed at a temperature of about 200° C., curve ③' shows a case where the Er and $SiO_2$ layers were annealed at a temperature of about 250° C., curve ④' shows a case where the Er and $SiO_2$ layers were annealed at a temperature of about 300° C., and curve ⑤' shows a case where the Er and $SiO_2$ layers were annealed at a temperature of about 350° C.

Referring to FIG. 3, in all cases ①' to ⑤', the conductance was reached at a peak around a value $V_{fb}$. The height of the peak reflects the interfacial characteristics of a high-k dielectric metal silicate layer. That is, it could be observed that as an annealing temperature was increased, the height of the peak was decreased. Thus, it could be seen that a high-k dielectric metal silicate layer manufactured using an interface processing process according to the present invention had better interfacial characteristics as the Er and $SiO_2$ layers were annealed at a higher temperature.

Figure 4:
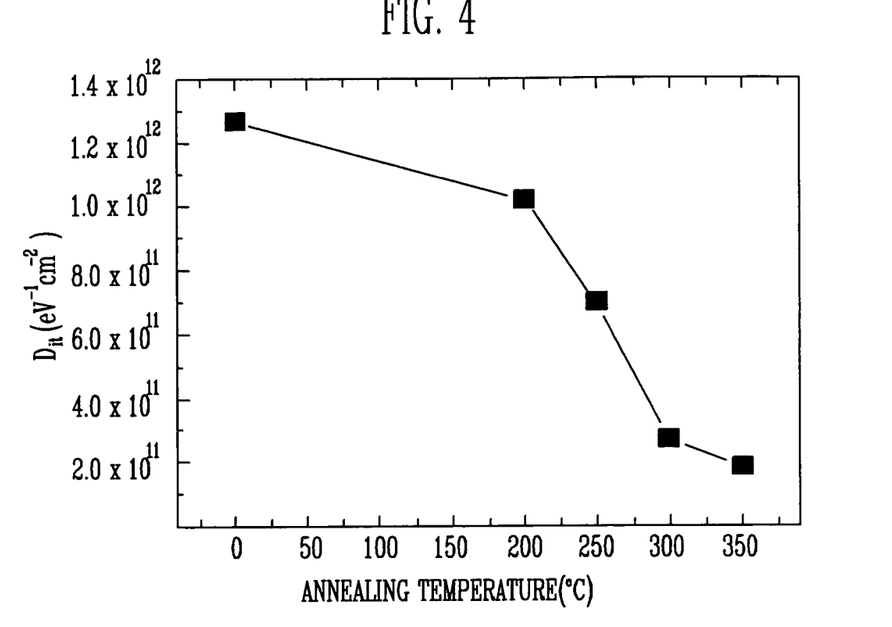
FIG. 4 is a graph showing variation of the density of interfacial state (D$_{it}$) value with respect to an annealing temperature in the Er/SiO$_2$ gate capacitor shown in FIG. 2.

FIG. 4 is a graph of the density of interfacial state ($D_{it}$) value versus an annealing temperature in the $Er/SiO_2$ gate capacitor shown in FIG. 2, in order to quantify the interfacial characteristics described with reference to FIG. 3.

In FIG. 4, an abscissa denotes an annealing temperature, and an ordinate denotes the density of interfacial state ($D_{it}$). Referring to FIG. 4, when the annealing temperature was gradually raised, the $D_{it}$ value was reduced, unlike when the Er and $SiO_2$ layers were annealed. For example, when the Er and $SiO_2$ layers were annealed at a temperature of about 350° C., the $D_{it}$ value was reduced to $1.8 \times 10^{11}$ $eV^{-1}$ $cm^{-2}$, which was at least 10 times lower than that of an $HfO_2$ layer that is the most widely used high-k dielectric thin layer. Therefore, it could be seen that a high-k dielectric metal silicate layer manufactured using the method according to the present invention had very good interfacial characteristics.

Figure 5A:
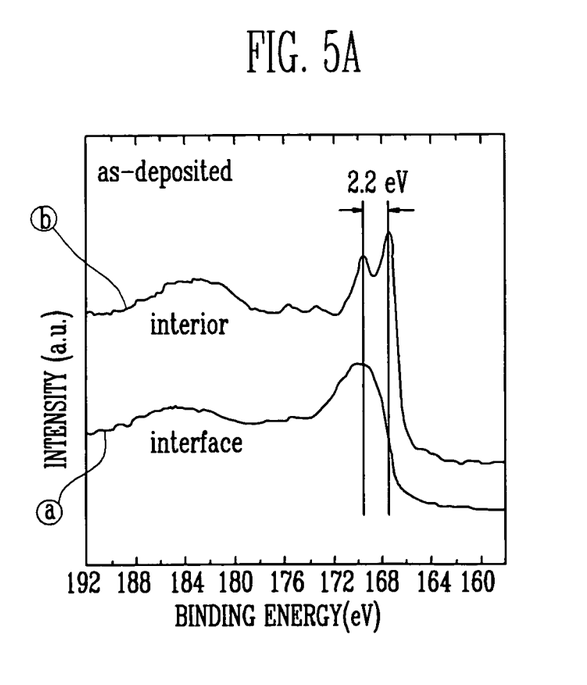
FIGS. 5A and 5B show 4-dimensional (4D) spectrums measured using an X-ray photoelectron spectroscopy (XPS) at the interior of the Er metal layer and an interface between the Er metal layer and a silicon substrate before and after each of the Er/SiO$_2$ gate capacitors shown in FIG. 2 is annealed at a temperature of about 250° C.
Figure 5B:
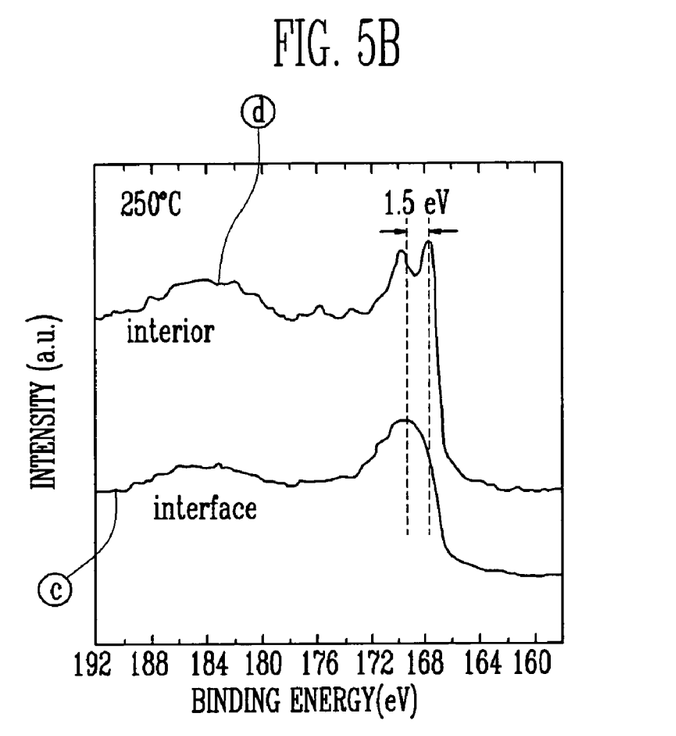

FIG. 5A shows 4-dimensional (4D) spectrums ⓑ and ⓐ measured using an X-ray photoelectron spectroscopy (XPS) at an interior of the Er metal layer and at an interface between the Er metal layer and a silicon substrate, respectively, before the $Er/SiO_2$ gate capacitor shown in FIG. 2 is annealed at a temperature of about 250° C., and FIG. 5B shows 4D spectrums ⓓ and ⓒ measured using the XPS at an interior of the Er metal layer and at an interface between the Er metal layer and the silicon substrate, respectively, after the $Er/SiO_2$ gate capacitor shown in FIG. 2 is annealed at a temperature of about 250° C. In FIGS. 5A and 5B, an abscissa denotes binding energy (eV) and an ordinate denotes intensity (a.u.).

Referring to the 4D spectrums ⓑ and ⓓ measured at the interior of the Er metal layer before and after an annealing process, respectively, it could be seen that the Er metal layer was remaining pure after the annealing process. In contrast, the 4D spectrums ⓐ and ⓒ, which were measured at the interface between the Er metal layer and the silicon substrate before and after the annealing process, respectively, were widely spread out and closed to high binding energy, compared with the 4D spectrums ⓑ and ⓓ. That is, it could be seen that an Er silicate layer was formed at the interface between the Er metal layer and the silicon substrate irrespective of whether the annealing process was performed or not. Also, binding energy of the Er layer measured before the annealing process was higher than after the annealing process due to the fact that a larger amount of silicon was contained in the Er silicate layer before the annealing process than after the annealing process. In other words, it could be seen that the Er silicate layer was containing more silicon than Er before the annealing process, and containing more Er than silicon after the annealing process.

Figure 6A:
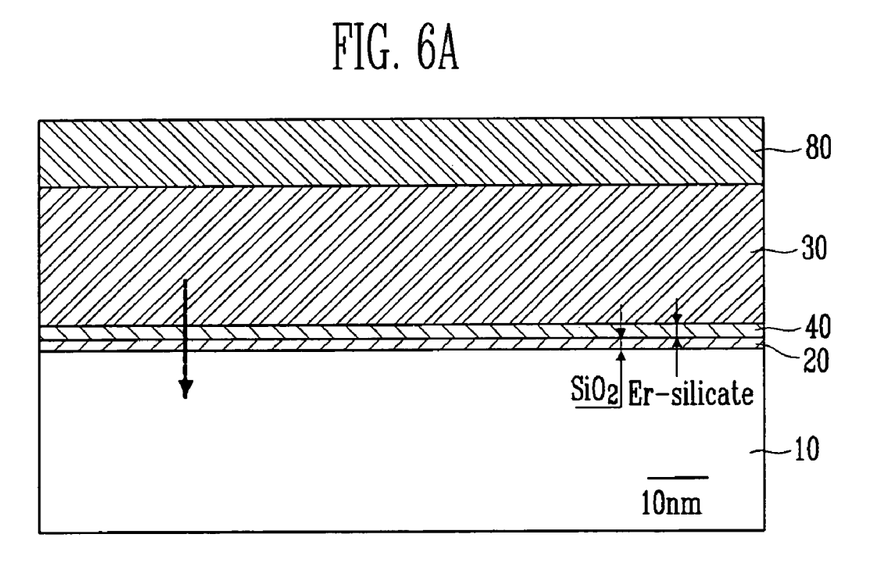
FIG. 6A is a scanning transmission electron microscopy (STEM) photograph of a cross-section of an Er/SiO$_2$ gate capacitor annealed at a temperature of about 250° C.
Figure 6B:
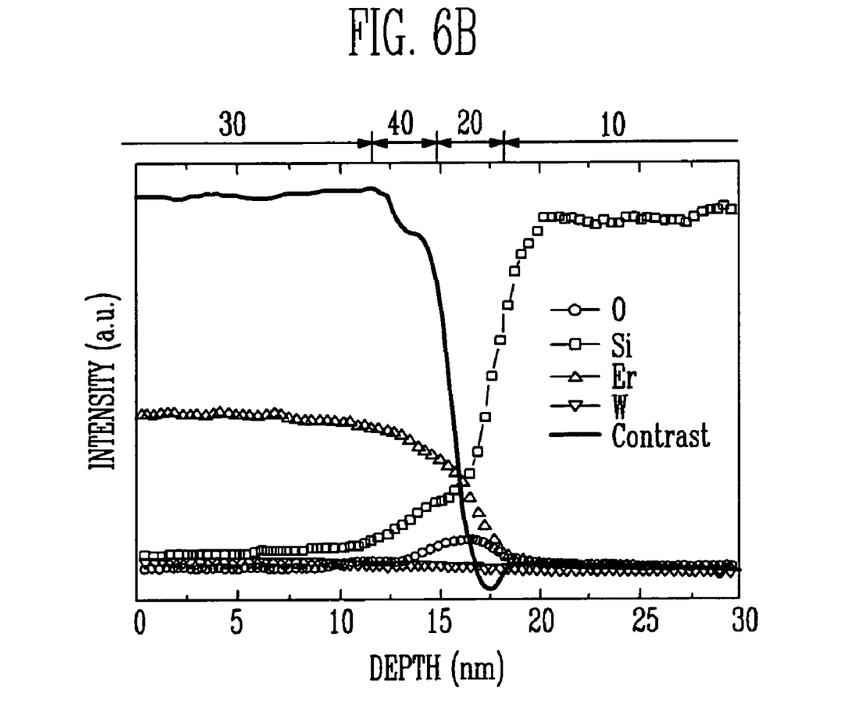
FIG. 6B is a graph showing energy dispersive x-ray spectrometer (EDX) line profiling of the Er/SiO$_2$ gate capacitor annealed at a temperature of about 250° C.

FIG. 6A is a scanning transmission electron microscopy (STEM) photograph of a cross-section of an $Er/SiO_2$ gate capacitor annealed at a temperature of about 250° C., and FIG. 6B is a graph showing energy dispersive x-ray spectrometer (EDX) line profiling of the Er/SiO$_2$ gate capacitor annealed at a temperature of about 250° C.

FIG. 6A shows a cross-section of an Er/SiO$_2$ gate capacitor that is manufactured by depositing an Er metal layer 30 with a thickness of 43 nm on a SiO$_2$ layer 20 with a thickness of 6.15 nm and annealing the Er metal layer and the SiO$_2$ layer at a temperature of about 250° C. Referring to the STEM photograph of FIG. 6A, it could be observed that two relatively uniform layers 20 and 40 having different contrasts were present between a silicon substrate 10 and the Er metal layer 30. In other words, it could be seen that the SiO$_2$ layer 20 was formed on the silicon substrate 10, and an Er silicate layer (i.e., a high-k dielectric silicate layer) 40 was formed on the SiO$_2$ layer 20. Meanwhile, a capping layer 80 was formed on the Er metal layer 30 of the Er/SiO$_2$ gate capacitor. The capping layer 80 was used to prevent external contamination of the Er metal layer 30 during the annealing process. The capping layer 80 was formed of tungsten (W) with a thickness of 23 nm. In the STEM photograph, contrast intensity was proportional to an atomic number. Therefore, it could be estimated that, among the two layers interposed between the Er metal layer 30 and the silicon substrate 10, a bright upper layer was the Er silicate layer 40, and a dark lower layer was the SiO$_2$ layer 20.

FIG. 6B shows EDX line profiles of Er, W, Si, and O that are obtained in an arrow direction ↓. Referring to FIG. 6B, it could be seen that an Er-silicate layer 40 made of a mixture of Er, Si, and O was formed between the Er metal layer 30 and the silicon substrate 10, and the SiO$_2$ layer 20, which did not react with Er, was remaining under the Er-silicate layer 40.

FIGS. 7A through 7E are TEM photographs of cross-sections of Er/SiO$_2$ gate capacitors before and after they are annealed at various temperatures.

Figure 7A:
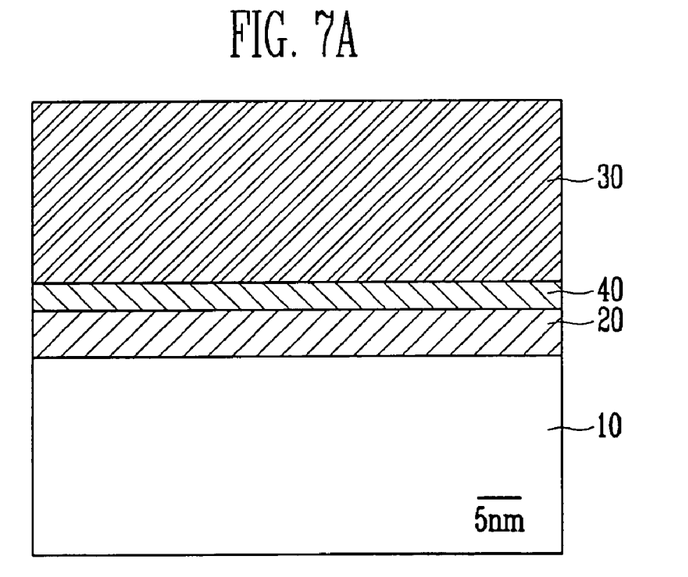
FIGS. 7A through 7E are transmission electron microscopy (TEM) photographs of cross-sections of Er/SiO$_2$ gate capacitors before and after the Er/SiO$_2$ gate capacitors are annealed at various temperatures.
Figure 7B:
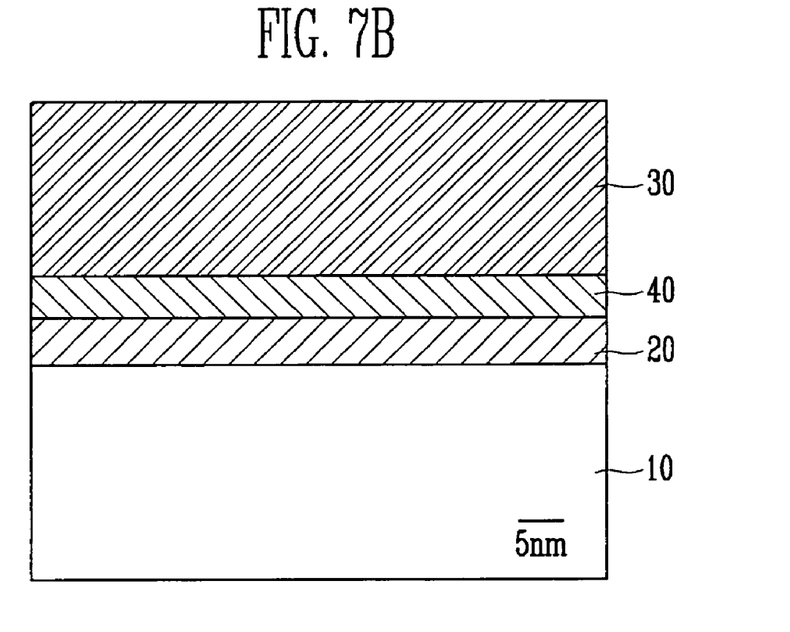
Figure 7C:
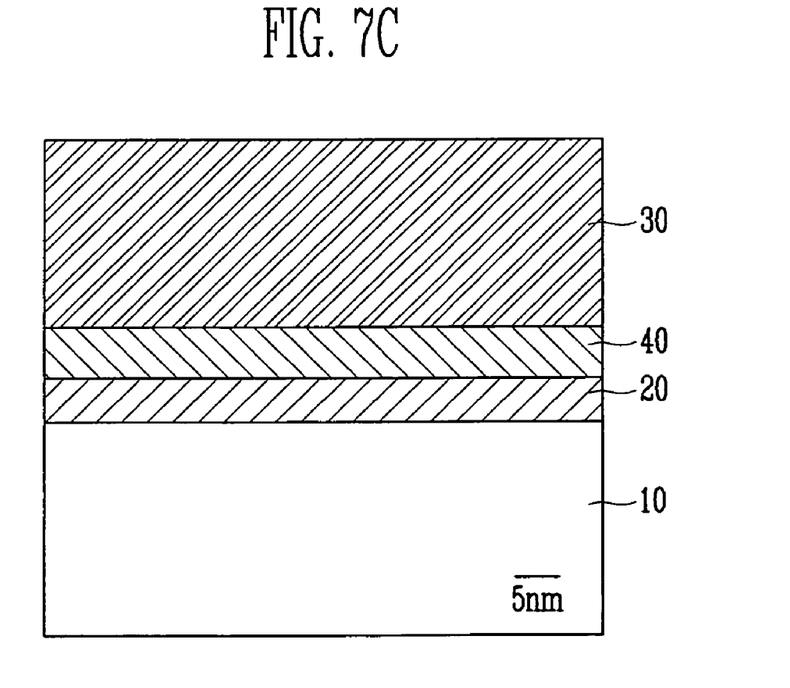
Figure 7D:
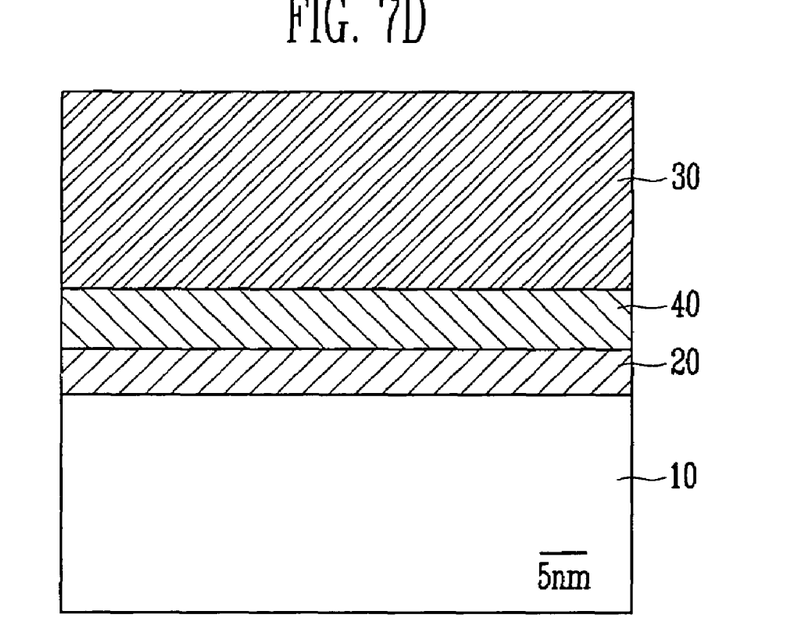
Figure 7E:
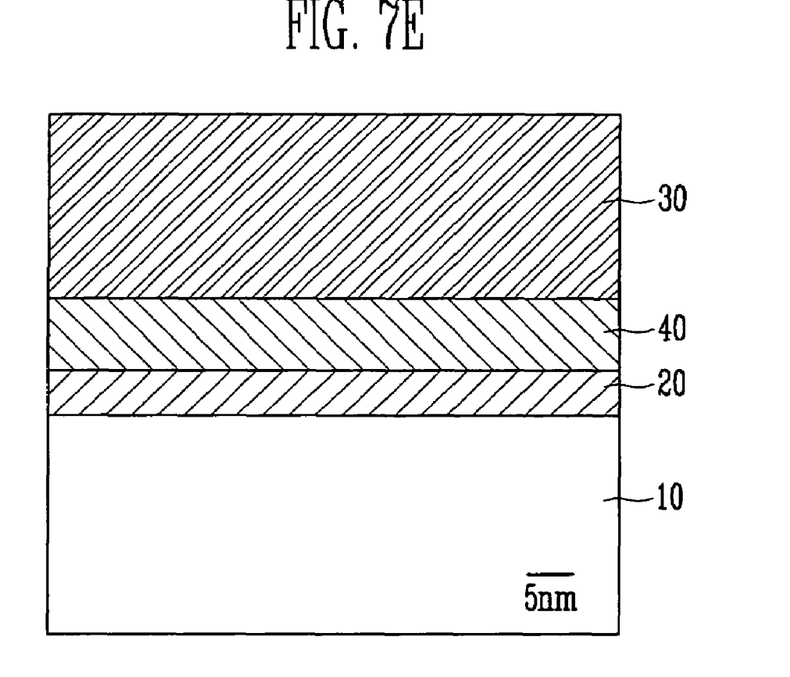

Referring to FIGS. 7A through 7E, as described above, it could be seen that an Er-silicate layer 40 and a SiO$_2$ layer 20 were formed between an Er metal layer 30 and a silicon substrate 10 irrespective of whether an annealing process was performed or not and an annealing temperature. FIG. 7A shows a case where Er and SiO$_2$ layers 30 and 20 are deposited, FIG. 7B shows a case where the Er and SiO$_2$ layers 30 and 20 are annealed at a temperature of about 200° C., FIG. 7C shows a case where the Er and SiO$_2$ layers 30 and 20 are annealed at a temperature of about 250° C., FIG. 7D shows a case where the Er and SiO$_2$ layers 30 and 20 are annealed at a temperature of about 300° C., and FIG. 7E shows a case where the Er and SiO$_2$ layers 30 and 20 are annealed at a temperature of about 350° C. Referring to FIGS. 7A through 7E, it could be seen that the thicknesses of the Er-silicate layer 40 and the SiO$_2$ layer 20 varied with annealing temperature. Specifically, as the annealing temperature was increased, the thickness of the Er-silicate layer 40 was also increased, but the thickness of the SiO$_2$ layer was decreased. This may be due to the fact that as the annealing temperature increases, a larger amount of Er thermally diffuses from the Er metal layer 30 serving as a gate electrode and reacts with the SiO$_2$ layer 20, thus further forming the Er-silicate layer 40.

Figure 8:
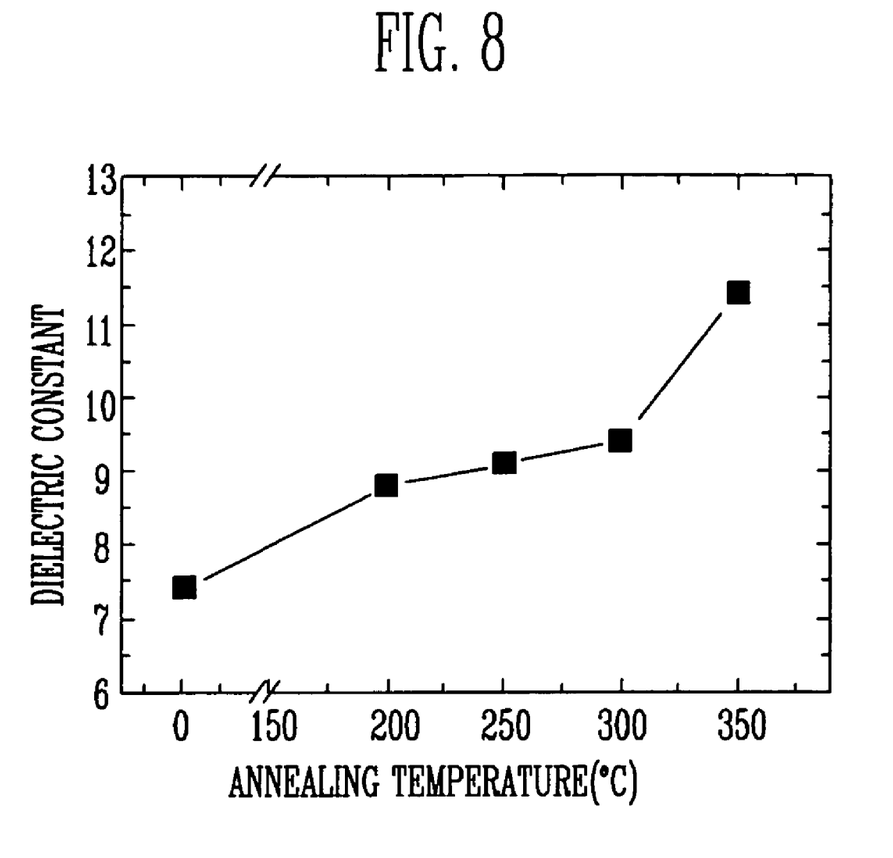
FIG. 8 is a graph showing variation of a dielectric constant of an Er silicate layer with respect to an annealing temperature.

FIG. 8 is a graph of a dielectric constant of an Er silicate layer versus an annealing temperature, which is calculated using the EOT value obtained in FIG. 2 and the thicknesses of the Er-silicate layer and the SiO$_2$ layer measured in FIGS. 7A through 7E.

In FIG. 8, an abscissa denotes an annealing temperature and an ordinate denotes a dielectric constant. Referring to FIG. 8, it could be seen that as the annealing temperature was increased, the dielectric constant was also increased. This phenomenon is closely associated with a chemical bonding state of the Er-silicate layer. That is, as can be seen from the XPS results shown in FIGS. 5A and 5B, an Er-silicate layer containing a large amount of Er was formed due to diffusion of Er after an annealing process, and as an annealing temperature was increased, an Er-silicate layer containing a larger amount of Er was formed.

According to the exemplary embodiments of the present invention as described above, a semiconductor device is manufactured by forming a high-k dielectric gate oxide layer using an interfacial reaction. In this case, the high-k dielectric gate oxide layer can have excellent interfacial characteristics, and semiconductor devices having high performance and quality can be manufactured by a simpler process at lower cost as compared with manufacturing semiconductor devices including a conventional high-k dielectric thin layer.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing a semiconductor device, the method comprising the steps of:
   forming an oxide layer on a silicon substrate;
   depositing a metal layer on the oxide layer;
   forming a metal silicate layer using an interfacial reaction between the oxide layer and the metal layer;
   forming a metal gate by etching the metal silicate layer and the metal layer; and
   forming a lightly doped drain (LDD) region and source and drain regions in the silicon substrate after forming the metal gate,
   wherein the interfacial reaction is induced by performing an annealing process after depositing the metal layer on the oxide layer.

2. The method according to claim 1, wherein the silicon substrate is one selected from the group consisting of a single crystalline silicon substrate, a polycrystalline silicon substrate, a doped silicon substrate, an amorphous silicon substrate, a Si$_x$Ge$_{1-x}$ (0<x<1) substrate, a Si$_x$N$_{1-x}$ (0<x<1) substrate, and an SiC substrate.

3. The method according to claim 1, wherein the oxide layer is formed of a combination of oxygen and one selected from the group consisting of Si, Ga, Ge, Ce, Pr, Nd, Pm, Sm, Eu, Gd, Tb, Dy, Ho, Er, Tm, Yb, Lu, Ni, Ti, Co, Cu, Pt, W, Cr, Mo, Au, Ag, Zn, Ir, Ta, Hf, K, Li, Cs and an alloy thereof.

4. The method according to claim 1, wherein the metal layer is formed of at least one selected from the group consisting of Ce, Pr, Nd, Pm, Sm, Eu, Gd, Tb, Dy, Ho, Er, Tm, Yb, Lu, Ni, Ti, Go, Cu, Pt, W, Cr, Mo, Au, Ag, Zn, Ir, Ta, Hf, K, Li, Cs and an alloy thereof.

5. A method of manufacturing a semiconductor device, the method comprising the steps of:
   forming an oxide layer on a silicon substrate;
   depositing a metal layer on the oxide layer;
   forming a metal silicate layer using an interfacial reaction between the oxide layer and the metal layer;
   depositing a metal layer for a gate electrode after removing the remaining metal layer which is unreacted in the interfacial reaction step; and forming a lightly doped drain (LDD) region and source and drain regions in the silicon substrate after etching the metal layer for a gate electrode and the metal silicate layer.

6. The method according to claim 5, wherein the interfacial reaction is induced by performing an annealing process after depositing the metal layer on the oxide layer.

7. The method according to claim 5, wherein the interfacial reaction is induced by kinetic energy that is spontaneously generated during the deposition of the metal layer on the oxide layer.

8. The method according to claim 7, wherein the metal layer deposited on the oxide layer is formed of one of a rare-earth material and a transition metal.

9. The method according to claim 5, wherein the silicon substrate is one selected from the group consisting of a single crystalline silicon substrate, a polycrystalline silicon substrate, a doped silicon substrate, an amorphous silicon substrate, a $Si_xGe_{1-x}$ ($0<x<1$) substrate, a $Si_xN_{1-x}$ ($0<x<1$) substrate, and an SiC substrate.

10. The method according to claim 5, wherein the oxide layer is formed of a combination of oxygen and one selected from the group consisting of Si, Ga, Ge, Ce, Pr, Nd, Pm, Sm, Eu, Gd, Tb, Dy, Ho, Er, Tm, Yb, Lu, Ni, Ti, Co, Cu, Pt, W, Cr, Mo, Au, Ag, Zn, Ir, Ta, Hf, K, Li, Cs and an alloy thereof.

11. The method according to claim 5, wherein the metal layer deposited on the oxide layer is formed of at least one selected from the group consisting of Ce, Pr, Nd, Pm, Sm, Eu, Gd, Tb, Dy, Ho, Er, Tm, Yb, Lu, Ni, Ti, Co, Cu, Pt, W, Cr, Mo, Au, Ag, Zn, Ir, Ta, Hf, K, Li, Cs and an alloy thereof.

12. A method of manufacturing a semiconductor device, the method comprising the steps of:

forming an oxide layer on a silicon substrate;
depositing a metal layer on the oxide layer;
forming a metal silicate layer using an interfacial reaction between the oxide layer and the metal layer;
forming a metal gate by etching the metal silicate layer and the metal layer; and
forming a lightly doped drain (LDD) region and source and drain regions in the silicon substrate after forming the metal gate,
wherein the interfacial reaction is induced by kinetic energy that is spontaneously generated during the deposition of the metal layer on the oxide layer.

13. The method according to claim 12, wherein the metal layer is formed of one of a rare-earth material and a transition metal.

14. The method according to claim 12, wherein the silicon substrate is one selected from the group consisting of a single crystalline silicon substrate, a polycrystalline silicon substrate, a doped silicon substrate, an amorphous silicon substrate, a $Si_xGe_{1-x}$ ($0<x<1$) substrate, a $Si_xN_{1-x}$ ($0<x<1$) substrate, and an SiC substrate.

15. The method according to claim 12, wherein the oxide layer is formed of a combination of oxygen and one selected from the group consisting of Si, Ga, Ge, Ce, Pr, Nd, Pm, Sm, Eu, Gd, Tb, Dy, Ho, Er, Tm, Yb, Lu, Ni, Ti, Co, Cu, Pt, W, Cr, Mo, Au, Ag, Zn, Ir, Ta, Hf, K, Li, Cs and an alloy thereof.

16. The method according to claim 12, wherein the metal layer is formed of at least one selected from the group consisting of Ce, Pr, Nd, Pm, Sm, Eu, Gd, Tb, Dy, Ho, Er, Tm, Yb, Lu, Ni, Ti, Co, Cu, Pt, W, Cr, Mo, Au, Ag, Zn, Ir, Ta, Hf, K, Li, Cs and an alloy thereof.

* * * * *